United States Patent [19]
Ono

[11] Patent Number: 5,428,497
[45] Date of Patent: Jun. 27, 1995

[54] DEVICE FOR DRIVING ROTARY SOLENOID

[75] Inventor: Fujio Ono, Atsugi, Japan

[73] Assignee: Unisia Jecs Corporation, Atsugi, Japan

[21] Appl. No.: 39,402

[22] PCT Filed: Aug. 28, 1992

[86] PCT No.: PCT/JP92/01104

§ 371 Date: Apr. 28, 1993

§ 102(e) Date: Apr. 28, 1993

[87] PCT Pub. No.: WO93/05524

PCT Pub. Date: Mar. 18, 1993

[30] Foreign Application Priority Data

Aug. 28, 1991 [JP] Japan .................. 3-217270

[51] Int. Cl.⁶ .................................. H02P 01/22
[52] U.S. Cl. .......................... 361/206; 318/293
[58] Field of Search ......... 361/160, 143, 191, 152, 361/206, 154, 210, 166, 167, 245, 246; 307/115; 335/228, 272; 318/280, 290, 293, 294

[56] References Cited

U.S. PATENT DOCUMENTS

| | | | |
|---|---|---|---|
| 4,765,426 | 8/1988 | Shimizu | 318/293 X |
| 4,924,158 | 5/1990 | Kelley et al. | 318/293 X |
| 4,988,931 | 1/1991 | Tsukahara et al. | 318/293 |

FOREIGN PATENT DOCUMENTS 62-6663 2/1987 Japan .
62-23060 6/1987 Japan .

*Primary Examiner*—Brian K. Young
*Assistant Examiner*—Fritz M. Fleming
*Attorney, Agent, or Firm*—Foley & Lardner

[57] ABSTRACT

A device for driving a rotary solenoid in which the two transistors on one side of an H-bridge circuit that drives the rotary solenoid are not simultaneously rendered conductive in order to prevent the burning. An instruction signal from the CPU is made up of a first instruction signal which instructs the rotation in either the forward direction or the reverse direction and a second instruction signal which instructs either the rotation or the holding. Depending upon the combinations of the first and second instruction signals, the output of the logic circuit renders the first to fourth transistors of the H-bridge circuit conductive or non-conductive.

1 Claim, 3 Drawing Sheets

DEVICE FOR DRIVING ROTARY SOLENOID

BACKGROUND OF THE INVENTION

1. Technical Field

The present invention relates to a device for driving a rotary solenoid.

2. BACKGROUND ART

The suspension of an automobile is adjusted by using, for example, a rotary solenoid which works to change the suspension characteristics into a soft mode and a hard mode, and such a rotary solenoid is driven by an H-bridge circuit as shown in FIG. 3.

That is, one end of the rotary solenoid RS is connected between a first transistor Tr1 and a second transistor Tr2 of a circuit that connects the power source $V_B$ ground via first and second transistors Tr1, Tr2. The other end of the rotary solenoid RS is connected between a third transistor Tr3 and a fourth transistor Tr4 of a circuit that connects the power source $V_B$ to ground via third and fourth transistors Tr3, Tr4. The first to fourth transistors Tr1 through Tr4 are rendered conductive or non-conductive in response to two signals A, B from a CPU (not shown in the figures), in order to turn the rotary solenoid RS forwardly, reversely or to hold it.

As the two signals, the CPU sends a forward instruction signal (switch-into hard signal) A and a reverse instruction signal (switch-into soft signal) B, as shown in FIG. 4.

Usually, when both the forward instruction signal A and the reverse instruction signal B have the L level, the forward instruction signal A which has the L level renders the first transistor Tr1 conductive and the second transistor Tr2 non-conductive. Further, the reverse instruction signal B which has the L level, renders the third transistor Tr3 conductive and the fourth transistor Tr4 non-conductive. In this case, therefore, the electric current to the rotary solenoid RS is interrupted, and the rotary solenoid RS is maintained in the holding condition.

To forwardly rotate, the forward instruction signal A only is allowed to have the H level. Then, the first transistor Tr1 is rendered non-conductive and the second transistor Tr2 is rendered conductive. Here, since the reverse instruction signal B remains at the L level, the third transistor Tr3 is rendered conductive and the fourth transistor Tr4 is rendered non-conductive. In this case, therefore, a current circuit in a direction of the arrow F in FIG. 3 is established from the power source $V_B$ to the third transistor Tr3, to the rotary solenoid RS, and to the second transistor Tr2, and the rotary solenoid RS rotates in the forward direction.

To reversely rotate, the reverse instruction signal B only is allowed to have the H level. Then, the third transistor Tr3 is rendered non-conductive and the fourth transistor Tr4 is rendered conductive. Moreover, since the forward instruction signal A remains at the L level, the first transistor Tr1 is rendered conductive and the second transistor Tr2 is rendered non-conductive. In this case, therefore, a current circuit in a direction of the arrow R in FIG. 3 is established from the power source $V_B$ to the first transistor Tr1, to the rotary solenoid RS, and to the fourth transistor Tr4, and the rotary solenoid RS rotates in the reverse direction.

According to the above-mentioned conventional device for driving the rotary solenoid, however, there momentarily takes place a short-circuited condition in which both the first transistor Tr1 and the second transistor Tr2 are rendered conductive at a moment when the forward instruction signal A rises or breaks, due to a delay in the response of the circuit. In the worst case, therefore, the transistors may be burnt out.

At a moment when the reverse instruction signal B rises or breaks, furthermore, the third transistor Tr3 and the fourth transistor Tr4 may develop similar problems. If the CPU operates abnormally, furthermore, the electric current to the rotary solenoid is interrupted to maintain reliability and safety.

An object of the present invention, therefore, is to provide a device for driving a rotary solenoid which will not develop such problems.

SUMMARY OF THE INVENTION

With a device for driving a rotary solenoid according to the present invention, one end of the rotary solenoid is connected between a first transistor and a second transistor of a circuit that connects a power source to ground via the first and second transistors, and the other end of the rotary solenoid is connected between a third transistor and a fourth transistor of a circuit that connects the power source to ground via the third and fourth transistor.

The first to fourth transistors are rendered conductive or non-conductive by a first instruction signal and a second instruction signal from a CPU. The CPU is provided with a means for outputting, as the first instruction signal, a signal instructing either forward rotation or reverse rotation and a means for outputting, as the second instruction signal, a signal instructing either rotation or holding.

A first logic circuit is established for rendering the first transistor conductive only when the first instruction signal instructs the reverse rotation and the second instruction signal instructs rotation.

A second logic circuit is established for rendering the second transistor conductive only when the first instruction signal instructs the forward rotation and the second instruction signal instructs rotation.

A third logic circuit is established for rendering the third transistor conductive only when the first instruction signal instructs the forward rotation and the second instruction signal instructs rotation.

A fourth logic circuit is established for rendering the fourth transistor conductive only when the first instruction signal instructs the reverse rotation and the second instruction signal instructs rotation.

A first tri-state buffer circuit is inserted between the first logic circuit and the first transistor. The first tri-state buffer circuit receives a reset signal from a runaway monitoring circuit of the CPU to render the first transistor non-conductive irrespective of the output from the first logic circuit.

A second tri-state buffer circuit is inserted between the second logic circuit and the second transistor. The second tri-state buffer circuit receives the reset signal from the runaway monitoring circuit of the CPU to render the second transistor non-conductive irrespective of the output from the second logic circuit.

A third tri-state buffer circuit is inserted between the third logic circuit and the third transistor. The third tri-state buffer circuit receives the reset signal from the runaway monitoring circuit of the CPU to render the third transistor non-conductive irrespective of the output from the third logic circuit.

A fourth tri-state buffer circuit is inserted between the fourth logic circuit and the fourth transistor. The fourth tri-state buffer circuit receives the reset signal from the runaway monitoring circuit of the CPU to render the fourth transistor non-conductive irrespective of the output from the fourth logic circuit.

With the above-mentioned construction, the transistors are all rendered non-conductive under the holding condition. Therefore, even when some transistors are rendered conductive during the rotation in the forward direction or in the reverse direction, the conductive condition is not established even momentarily by both the first transistor and the second transistor, or by both the third transistor and the fourth transistor. Thus, the short-circuited condition is avoided.

Also, if, with the first to fourth tri-state buffer circuits, the outputs of the first to fourth logic circuits are fixed to the safety side to render all of the first to fourth transistors non-conductive upon receipt of a reset signal from the runaway monitoring circuit of the CPU, the short-circuited condition is avoided even if the CPU operates abnormally.

DETAILED DESCRIPTION OF THE PREFERRED EMBODIMENTS

Embodiments of the present invention will now be described in conjunction with the drawings.

Figure 1:
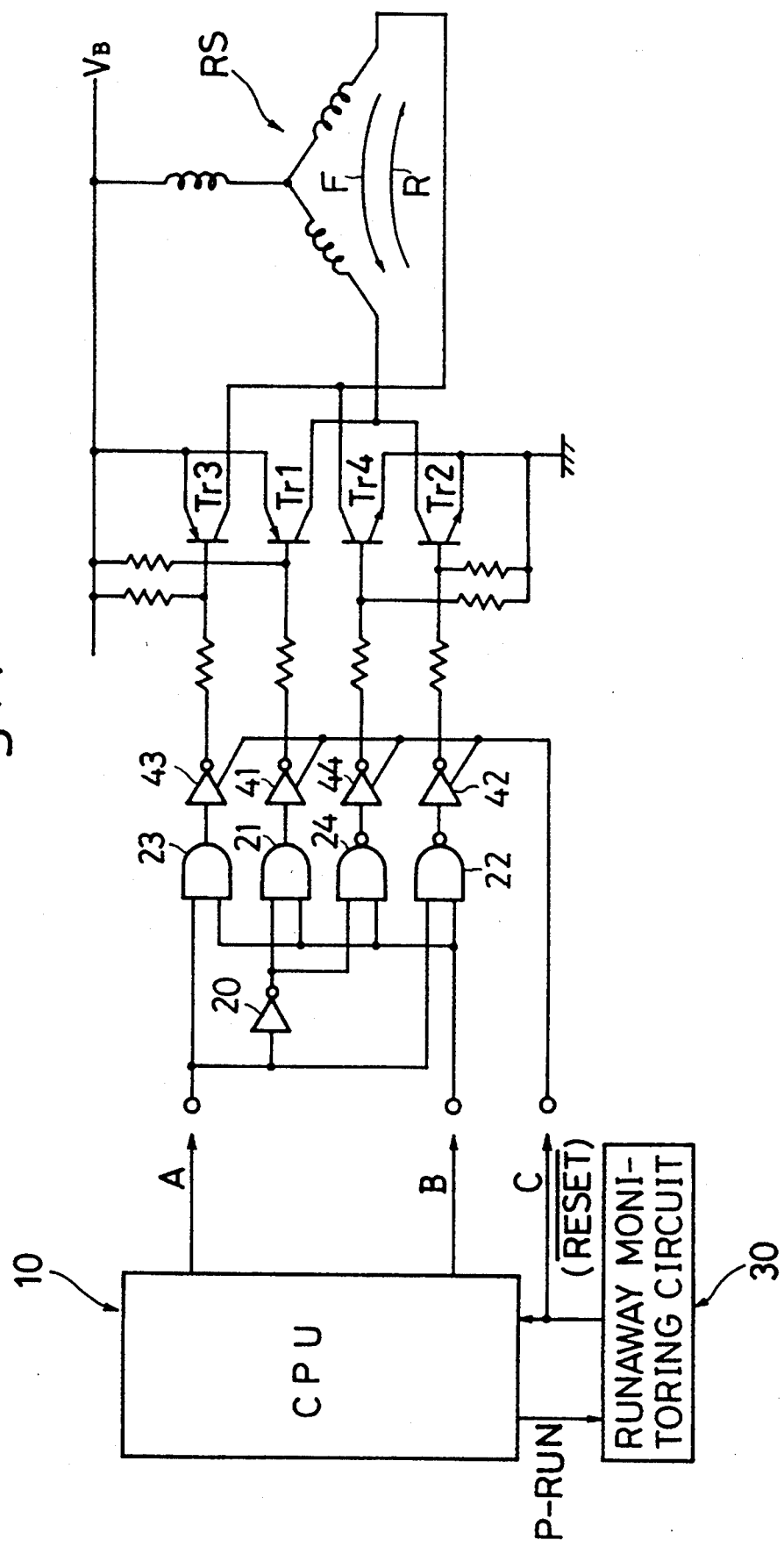
FIG. 1 is a diagram of a circuit illustrating one embodiment of the present invention.
Figure 2:
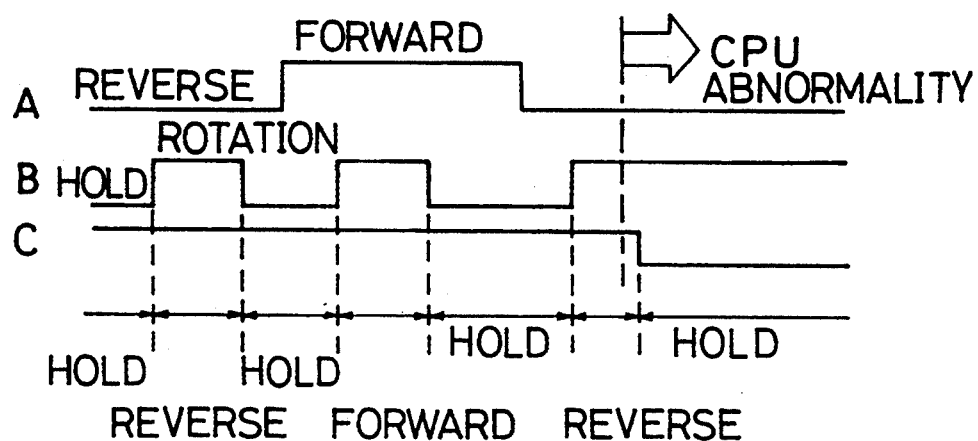
FIG. 2 is a timing chart of instruction signals according to said embodiment.
Figure 4:
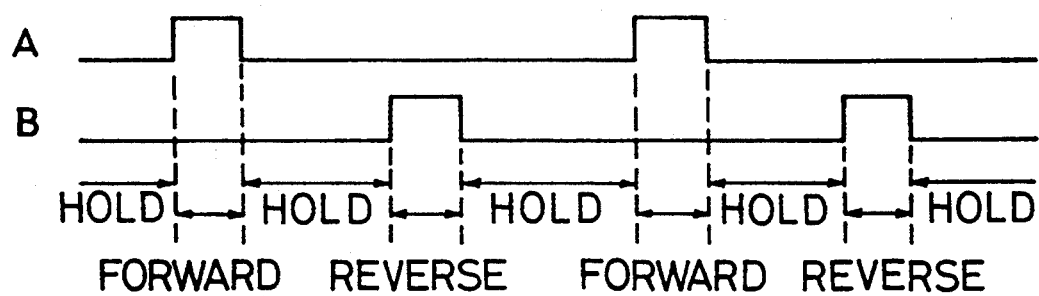
FIG. 4 is a timing chart of instruction signals according to the prior art.
Figure 3:
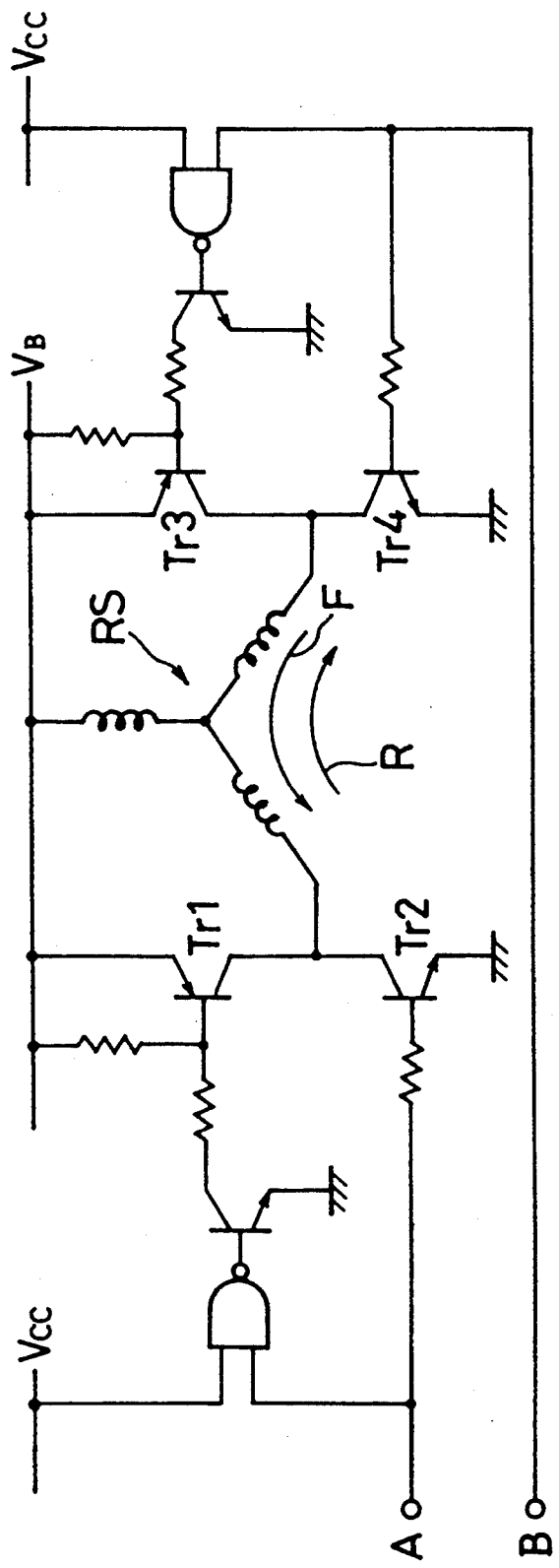
FIG. 3 is a diagram of a circuit according to a prior art.

FIG. 1 illustrates one embodiment and FIG. 2 illustrates the instruction signals of the embodiment.

One end of a rotary solenoid RS is connected across a first transistor Tr1 and a second transistor Tr2 of a circuit that connects a power source $V_B$ to ground via the first transistor Tr1 and the second transistor Tr2, and the other end of the rotary solenoid RS is connected across a third transistor Tr3 and a fourth transistor Tr4 of a circuit that connects the power source $V_B$ to ground via the third transistor Tr3 and the fourth transistor Tr4. This connection is the same as the conventional one.

According to the present invention, two signals A and B from a CPU 10 work to render the first to fourth transistors Tr1 to Tr4 conductive or non-conductive in order to rotate the rotary solenoid RS forwardly, reversely or to hold it. Here, the two signals from the CPU 10 are made up of a first instruction signal (forward/reverse signal) A which instructs the rotation in either the forward direction or the reverse direction and a second instruction signal (rotation/holding signal) B which instructs either rotation or holding.

Also, a NOT circuit 20 for inverting the first instruction signal A and a first logic circuit 21 through a fourth logic circuit 24 (gates) to be described herein below are provided.

The first logic circuit 21 is constituted by an AND circuit wherein the first instruction signal A is input after inverted by the NOT circuit 20 and the second instruction signal is input, and produces an output of the H level only when the first instruction signal A instructs the reverse rotation (L level) and the second instruction signal B instructs rotation (H level).

The second logic circuit 22 is constituted by a NAND circuit wherein the first and second instruction signals A, B are input, and produces an output of the L level only when the first instruction signal A instructs the forward rotation (H level) and the second instruction signal B instructs rotation (H level).

The third logic circuit 23 is constituted by an AND circuit wherein the first and second instruction signals A, B are input, and produces an output of the H level only when the first instruction signal A instructs the forward rotation (H level) and the second instruction signal instructs rotation (H level).

The fourth logic circuit 24 is constituted by a NAND circuit wherein the first instruction signal A is input after inverted by the NOT circuit 20 and the second instruction signal B is input, and produces an output of the L level only when the first instruction signal A instructs the reverse rotation (L level) and the second instruction signal B instructs rotation (H level).

A first tri-state buffer circuit 41 is inserted between the first logic circuit 21 and the first transistor Tr1. Under normal conditions, the first tri-state buffer circuit 41 produces an output of the L level, when the output of the first logic circuit 21 is at the H level, to render the first transistor Tr1 of PNP type conductive. However, the output of the first tri-state buffer circuit 41 is fixed to the H level to render the first transistor Tr1 non-conductive irrespective of the output of the first logic circuit 21 when a reset signal of the L level is output upon receipt of a signal from a runaway monitoring circuit 30 of the CPU 10.

A second tri-state buffer circuit 42 is inserted between the second logic circuit 22 and the second transistor Tr2. Under normal conditions the second tri-state buffer circuit 42 produces an output of the H level, when the output of the second logic circuit 22 is at the L level, to render the second transistor Tr2 of NPN type conductive. However, the output of the second tri-state buffer circuit 42 is fixed to the L level to render the second transistor Tr2 non-conductive irrespective of the output of the second logic circuit 22 when a reset signal of the L level is output upon receipt of a signal from the runaway monitoring circuit 30 of the CPU 10.

A third tri-state buffer circuit 43 is inserted between the third logic circuit 23 and the third transistor Tr3. Under normal conditions, the third tri-state buffer circuit 43 produces an output of the L level, when the output of the third logic circuit 23 is at the H level, to render the third transistor Tr3 of PNP type conductive. However, the output of the third tri-state buffer circuit 43 is fixed to the H level to render the third transistor Tr3 non-conductive irrespective of the output of the third logic circuit 23 when a reset signal of the L level is output upon receipt of a signal from the runaway monitoring circuit 30 of the CPU 10.

A fourth tri-state buffer circuit 44 is inserted between the fourth logic circuit 24 and the fourth transistor Tr4. Under normal conditions, the fourth tri-state buffer circuit 44 produces an output of the H level, when the output of the fourth logic circuit 24 is at the L level, to render the fourth transistor Tr4 of NPN type conductive. However, the output of the fourth tri-state buffer circuit 44 is fixed to the L level to render the fourth transistor Tr4 non-conductive irrespective of the output from the fourth logic circuit 24 when a reset signal of the L level is output upon receipt of a signal from the runaway monitoring circuit 30 of the CPU 10.

The runaway monitoring circuit 30 monitors a program-run (P-RUN) signal of the CPU 10 and outputs a reset signal of the L level under abnormal conditions.

The operation will be described next in conjunction with FIGS. 1 and 2.

When the second instruction signal B has the L level representing holding, the third logic circuit (AND circuit) 23 produces an output of the L level, the first logic circuit (AND circuit) 21 produces an output of the L level, the fourth logic circuit (NAND circuit) 24 produces an output of the H level and the second logic circuit (NAND circuit) 22 produces an output of the H level irrespective of whether the first instruction signal A has the H level or the L level representing the forward rotation or the reverse rotation. Therefore, the third transistor Tr3, the first transistor Tr1, the fourth transistor Tr4 and the second transistor Tr2 are all rendered non-conductive.

In this case, therefore, the current to the rotary solenoid RS is interrupted, and the rotary solenoid RS is placed in the holding condition.

To forwardly rotate, the second instruction signal B is rendered to assume the H level that represents rotation under the condition where the first instruction signal A is rendered to assume the H level that represents forward rotation. Then, the third logic circuit (AND circuit) 23 produces an output of the H level, the first logic circuit (AND circuit) 21 produces an output of the L level, the fourth logic circuit (NAND circuit) 24 produces an output of the H level and the second logic circuit (NAND circuit) 22 produces an output of the L level. Therefore, the third transistor Tr3 is rendered conductive, the first transistor Tr1 is rendered non-conductive, the fourth transistor Tr4 is rendered non-conductive, and the second transistor Tr2 is rendered conductive.

In this case, therefore, a current circuit is established in the direction of arrow F from the power source $V_B$ to the third transistor Tr3, to the rotary solenoid RS, and to the second transistor Tr2, and the rotary solenoid RS rotates in the forward direction.

To reversely rotate, the second instruction signal B is rendered to assume the H level that represents rotation under the condition where the first instruction signal A is rendered to assume the L level that represents reverse rotation. The third logic circuit (AND circuit) 23 produces an output of the L level, the first logic circuit (AND circuit) 21 produces an output of the H level, the fourth logic circuit (NAND circuit) 24 produces an output of the L level and the second logic circuit (NAND circuit) 22 produces an output of the H level. Therefore, the third transistor Tr3 is rendered non-conductive, the first transistor Tr1 is rendered conductive, the fourth transistor Tr4 is rendered conductive, and the second transistor Tr2 is rendered non-conductive.

In this case, therefore, a current circuit is established in the direction of arrow R from the power source $V_B$ to the first transistor Tr1, to the rotary solenoid RS, and to the fourth transistor Tr4, and the rotary solenoid RS rotates in the reverse direction.

Under the holding condition, therefore, the transistors are all rendered non-conductive; i.e., the current is permitted to flow into the transistors only at the time of the forward rotation or the reverse rotation. Therefore, the first transistor Tr1 and the second transistor Tr2 are not both rendered conductive, or the third transistor Tr3 and the fourth transistor Tr4 are not both rendered conductive.

Further, when the CPU 10 is normal, therefore, the above-mentioned logic output determined by the first instruction signal A and the second instruction signal B is directly output to the first to fourth transistors Tr1 to Tr4. When the CPU 10 is abnormal, however, the runaway monitoring circuit 30 outputs a reset signal of the L level, so that the outputs of the first to fourth tri-state buffer circuits 41 to 44 are fixed to the high-impedance state. As a result, the logic is fixed by the pull-up/pull-down resistances of the transistors Tr1 to Tr4, whereby the transistors Tr1 to Tr4 are all rendered non-conductive, the current to the rotary solenoid RS is interrupted, and the holding condition is maintained by the A, B, and C signals shown in FIG. 2.

Even when the CPU 10 becomes abnormal, therefore, the electric current flowing into the rotary solenoid RS is interrupted, contributing to improving the reliability and safety.

According to the present invention as described above, the electric current is permitted to flow into the transistors only at the time of the forward rotation or the reverse rotation. Therefore, the two transistors on one side of the H-bridge circuit are never rendered conductive simultaneously, and the transistors are prevented from being burnt out and the reliability is improved.

Even when the CPU operates abnormally, furthermore, the electric current flowing into the rotary solenoid is interrupted contributing to improving the reliability and safety.

Therefore, the device finds a wide industrial applicability.

I claim:

1. A device for driving a rotary solenoid to rotate the rotary solenoid forward, in reverse or to hold the solenoid, wherein one end of the rotary solenoid is connected between a first transistor and a second transistor of a circuit that connects a power source to ground via said first and second transistors, another end of the rotary solenoid is connected between a third transistor and a fourth transistor of a circuit that connects the power source to ground via said third and fourth transistors, and said first to fourth transistors are rendered conductive or non-conductive in accordance with a first and a second instruction signal from a CPU; and, wherein the CPU outputs said first instruction signal, instructing either forward rotation or reverse rotation and outputs said second instruction signal, instructing either rotation or holding;

said device comprising:

a first logic circuit for rendering said first transistor conductive only when said first instruction signal instructs the reverse rotation and said second instruction signal instructs rotation;

a second logic circuit for rendering said second transistor conductive only when said first instruction signal instructs the forward rotation and said second instruction signal instructs rotation;

a third logic circuit for rendering said third transistor conductive only when said first instruction signal instructs the forward rotation and said second instruction signal instructs rotation;

a fourth logic circuit for rendering said fourth transistor conductive only when said first instruction signal instructs the reverse rotation and said second instruction signal instructs rotation;

a first tri-state buffer circuit inserted between said first logic circuit and said first transistor, for receiving a reset signal from a runaway monitoring circuit of the CPU to render said first transistor non-conductive irrespective of the output of the first logic circuit;

a second tri-state buffer circuit inserted between said second logic circuit and said second transistor, for receiving the reset signal from said runaway monitoring circuit of the CPU to render said second transistor non-conductive irrespective of the output of the second logic circuit;

a third tri-state buffer circuit inserted between said third logic circuit and said third transistor, for receiving the reset signal from said runaway monitoring circuit of the CPU to render said third transistor non-conductive irrespective of the output of the third logic circuit; and a fourth tri-state buffer circuit inserted between said fourth logic circuit and said fourth transistor, for receiving the reset signal from said runaway monitoring circuit of the CPU to render said fourth transistor non-conductive irrespective of the output of the fourth logic circuit.

* * * * *